US011450478B2

(12) United States Patent

Li et al.

(10) Patent No.: US 11,450,478 B2

(45) Date of Patent: Sep. 20, 2022

(54) ASSEMBLY DEVICE FOR THREE-DIMENSIONAL TRIANGULAR IRON CORE

(71) Applicant: QINGDAO YUNLU ADVANCED MATERIALS TECHNOLOGY CO., LTD., Shandong (CN)

(72) Inventors: Xiaoyu Li, Shandong (CN); Jing Pang, Shandong (CN); Qinghua Li, Shandong (CN); Chen Li, Shandong (CN); Fei Cheng, Shandong (CN)

(73) Assignee: QINGDAO YUNLU ADVANCED MATERIALS TECHNOLOGY CO., LTD., Shandong (CN)

( * ) Notice: Subject to any disclaimer, the term of this patent is extended or adjusted under 35 U.S.C. 154(b) by 487 days.

(21) Appl. No.: 16/482,707

(22) PCT Filed: Dec. 12, 2018

(86) PCT No.: PCT/CN2018/120488

§ 371 (c)(1),
(2) Date: Jul. 31, 2019

(87) PCT Pub. No.: WO2020/056938

PCT Pub. Date: Mar. 26, 2020

(65) Prior Publication Data

US 2021/0358687 A1 Nov. 18, 2021

(30) Foreign Application Priority Data

Sep. 17, 2018 (CN) ......................... 201811081055.4

(51) Int. Cl.

*B23P 19/00* (2006.01)
*H05K 13/04* (2006.01)
*H01F 41/02* (2006.01)

(52) U.S. Cl.

CPC ................................ *H01F 41/0206* (2013.01)

(58) Field of Classification Search

CPC .................................................. H01F 41/0206

See application file for complete search history.

(56) References Cited

U.S. PATENT DOCUMENTS 10,937,580 B2 * 3/2021 Xu ........................ H01F 27/263

FOREIGN PATENT DOCUMENTS

CN 104599830 A 5/2015
CN 105196205 A 12/2015

(Continued)

OTHER PUBLICATIONS

International Search Report for PCT/CN2018/120488 dated Feb. 28, 2019, ISA/CN.

*Primary Examiner* — Paul D Kim

(74) *Attorney, Agent, or Firm* — Yue (Robert) Xu; Apex Attorneys at Law, LLP

(57) ABSTRACT

An assembly device for a three-dimensional triangular iron core is provided according to the present application, including iron core driving devices each for driving an iron core to be assembled with adjacent iron cores. There are three iron core driving devices, and each of the iron core driving devices includes an iron core fixing device and a driving assembly for driving the iron core fixing device to move. When the three-dimensional triangular iron core is required to be assembled, firstly, the three iron cores are mounted on the corresponding iron core fixing devices respectively, then the iron core fixing devices are driven by driving assemblies to move toward one another, thereby driving adjacent iron cores to move toward each other until the adjacent iron cores are assembled, and then each two adjacent iron cores are wound and assembled.

17 Claims, 6 Drawing Sheets

(56) References Cited

FOREIGN PATENT DOCUMENTS

| | | | |
|---|---|---|---|
| CN | 205057844 | U | 3/2016 |
| CN | 105719827 | A | 6/2016 |
| CN | 206672781 | U | 11/2017 |
| CN | 207529802 | U | 6/2018 |
| CN | 108878130 | A | 11/2018 |
| WO | 2005027155 | A1 | 3/2005 |

* cited by examiner

ASSEMBLY DEVICE FOR THREE-DIMENSIONAL TRIANGULAR IRON CORE

The application is the national phase of International Application No. PCT/CN2018/120488, titled "ASSEMBLY DEVICE FOR THREE-DIMENSIONAL TRIANGULAR IRON CORE", filed on Dec. 12, 2018, which claims the priority to Chinese Patent Application No. 201811081055.4 titled "ASSEMBLY DEVICE FOR THREE-DIMENSIONAL TRIANGULAR IRON CORE", filed with the China National Intellectual Property Administration on Sep. 17, 2018, the entire disclosures of which are incorporated herein by reference.

FIELD

The present application relates to the technical field of assembly tools for iron cores, and in particular to an assembly device for a three-dimensional triangular iron core.

BACKGROUND

An amorphous alloy transformer has characteristics of ultra-low loss, high capacity and long service life. Iron cores of amorphous alloy transformers include a planar amorphous alloy iron core and a three-dimensional triangular amorphous alloy iron core. Compared with the planar amorphous alloy iron core, the three-dimensional triangular amorphous alloy iron core is greatly improved in terms of no-load loss and sudden short circuit prevention, and therefore it is widely used.

The three-dimensional triangular iron core is formed by assembling three iron cores having three-dimensional triangular structures according to certain rules. During assembling, generally, three iron cores are placed upright, and each two adjacent iron cores are wound and assembled. However, since the supporting strength of the amorphous strip material of the triangular iron core is small, when the iron core is placed upright, the weight of the iron core may cause the strip material at the bottom of the iron core to be pressed and deformed, thereby affecting the performance of the iron core and resulting in poor assembly quality of the iron core.

Therefore, a technical problem to be addressed by those skilled in the art is to improve the assembly quality of the iron core.

SUMMARY

An object of the present application is to provide an assembly device for a three-dimensional triangular iron core, to improve the assembly quality of the iron core.

To achieve the above object, an assembly device for a three-dimensional triangular iron core is provided according to the present application, including iron core driving devices each configured for driving an iron core to be assembled with adjacent iron cores. There are three iron core driving devices, each of the iron core driving devices includes an iron core fixing device and a driving assembly configured for driving the iron core fixing device to move.

Preferably, the driving assembly includes a support member and a sliding device configured for driving the support member to move, and the iron core fixing device is mounted on the support member.

Preferably, the assembly device for the three-dimensional triangular iron core further includes a bearing platform, the driving assembly includes a guide rail configured to allow the support member to slide on, the guide rail is mounted on the bearing platform, a bottom end of the support member is provided with a slide groove cooperating with the guide rail, an angle between center lines of each two adjacent guide rails in length directions is 120 degrees, and the sliding device is mounted on the bearing platform.

Preferably, the iron core fixing device includes a connecting member and two electromagnets configured to be fitted to upper and lower column sections respectively in a case that the iron core is placed upright, the two electromagnets are mounted at two opposite ends of the connecting member respectively, the connecting member is hinged to the support member, and in a case that the iron core is placed flat, the iron core is supported by the two electromagnets.

Preferably, the driving assembly further includes a turnover device configured for driving the iron core to rotate, to allow the iron core to be placed upright or flat, one end of the turnover device is connected to the support member, and another end of the turnover device is connected to the iron core fixing device.

Preferably, a side portion of a top end of the support member is provided with a support portion configured for supporting the iron core in a case that the iron core is placed flat, and a side end of the support member is provided with a limiting portion configured for limiting the iron core in a case that the iron core is placed upright.

Preferably, a width of the connecting member is smaller than a width of a window of the iron core.

Preferably, each of the two electromagnets is of a rectangular structure allowed to be fitted to a corresponding column section of the iron core.

Preferably, two ends of the guide rail are each provided with a limiting block.

Preferably, the sliding device is a linear motor or a telescopic cylinder.

In the above technical solutions, an assembly device for a three-dimensional triangular iron core according to the present application includes iron core driving devices each configured for driving the iron core to be assembled with adjacent iron cores. There are three iron core driving devices, and each of the iron core driving devices includes an iron core fixing device and a driving assembly for driving the iron core fixing device to move. When the three-dimensional triangular iron core is required to be assembled, firstly, the three iron cores are mounted on the corresponding iron core fixing devices respectively, then the iron core fixing devices are driven by the driving assemblies to move toward one another, thereby driving adjacent iron cores to move toward each other until the adjacent iron cores are assembled, and then each two adjacent iron cores are wound and assembled.

It can be seen from above that, in the assembly device for the three-dimensional triangular iron core according to the present application, the driving assemblies drive the iron core fixing devices to move, thereby driving the adjacent iron cores to be assembled, which avoids the situation that gravity of the iron core is supported by itself during the assembly process, thus reducing the deformation of the iron core during the assembly process, and thereby improving the assembly quality of the iron core.

BRIEF DESCRIPTION OF THE DRAWINGS

For more clearly illustrating embodiments of the present application or the technical solutions in the conventional technology, drawings referred to describe the embodiments or the conventional technology will be briefly described hereinafter. Apparently, the drawings in the following description are only some examples of the present application, and for those skilled in the art, other drawings may be obtained based on these drawings without any creative efforts.

REFERENCE NUMERALS IN FIGS. 1 TO 10

1 bearing platform,
2 sliding device,
3 connecting member,
4 electromagnet,
5 hinge point,
6 guide rail,
7 iron core,
8 support member,

DETAILED DESCRIPTION

A core of the present application is to provide an assembly device for a three-dimensional triangular iron core, to improve the assembly quality of the iron core In order to make those skilled in the art better understand the technical solutions of the present application, the present application will be further described in detail hereinafter in conjunction with the drawings and embodiments.

Figure 1:
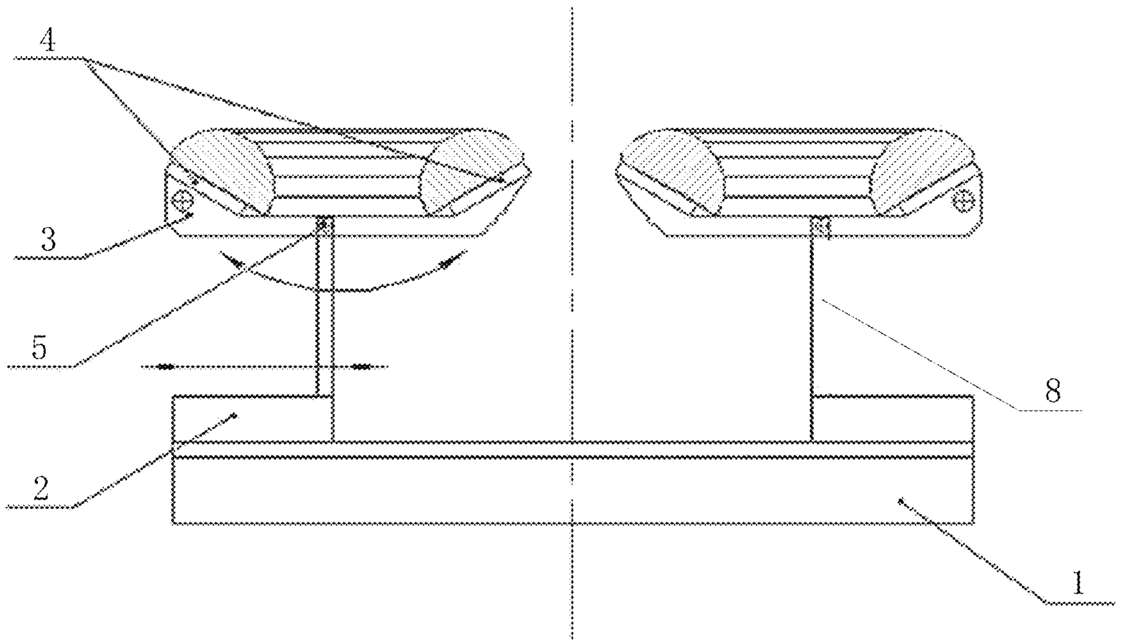
FIG. 1 is a schematic view showing the structure of an assembly device for a three-dimensional triangular iron core according to an embodiment of the present application in a case that iron cores are placed flat.
Figure 2:
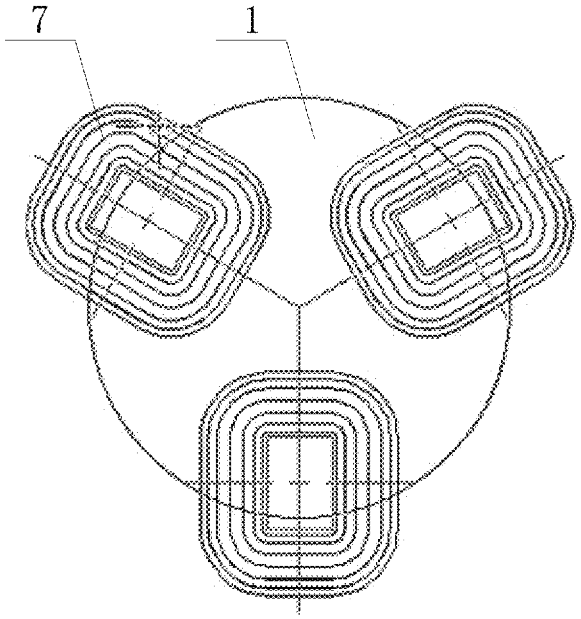
FIG. 2 is a top view of the assembly device for the three-dimensional triangular iron core according to the embodiment of the present application in a case that the iron cores are placed flat.
Figure 3:
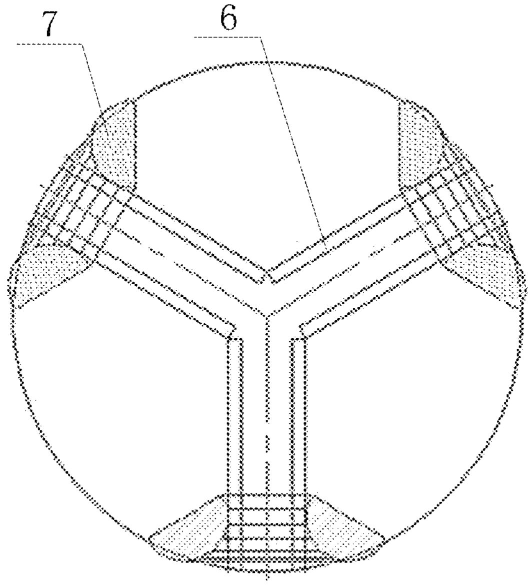
FIG. 3 is a top view of the assembly device for the three-dimensional triangular iron core according to the embodiment of the present application in a case that the iron cores are placed upright.
Figure 4:
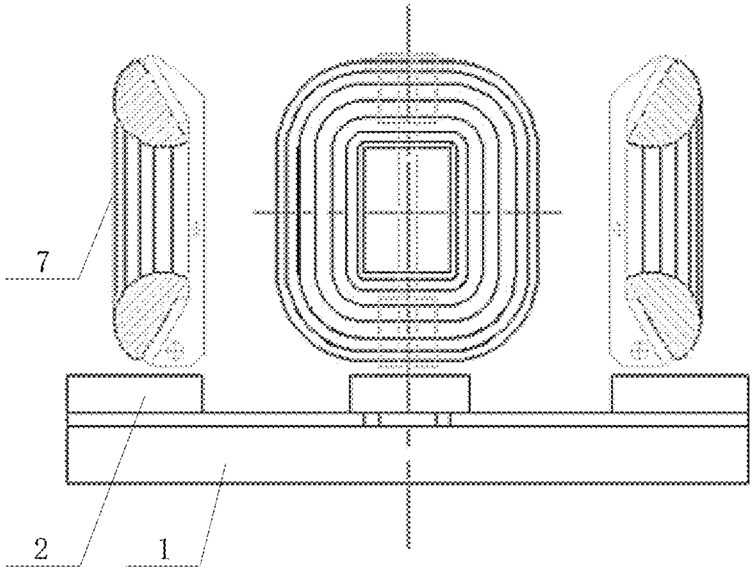
FIG. 4 is a schematic view showing the structure of the assembly device for the three-dimensional triangular iron core according to the embodiment of the present application in a case that the iron cores are placed upright.
Figure 5:
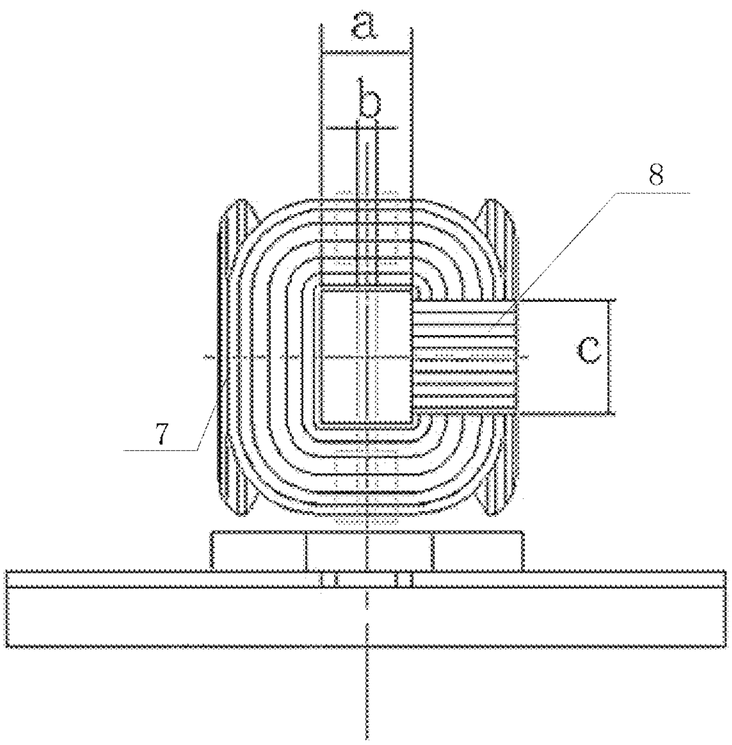
FIG. 5 is a schematic view showing the structure of the assembly device for the three-dimensional triangular iron core according to the embodiment of the present application after the iron cores are assembled.
Figure 6:
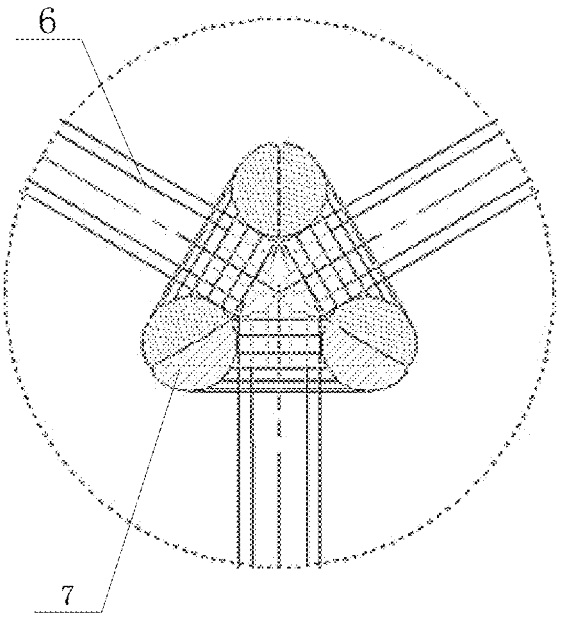
FIG. 6 is a top view of the assembly device for the three-dimensional triangular iron core according to the embodiment of the present application after the iron cores are assembled.
Figure 7:
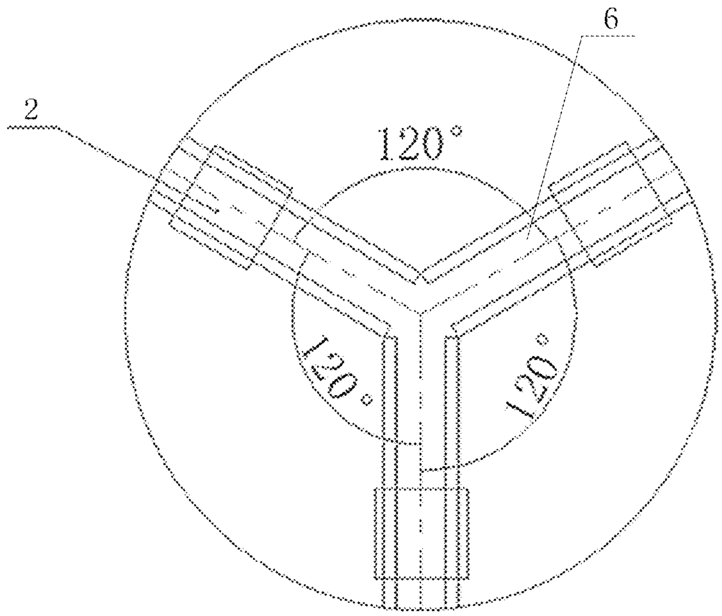
FIG. 7 is a view showing assembly positions of sliding devices and guide rails according to the embodiment of the present application.
Figure 8:
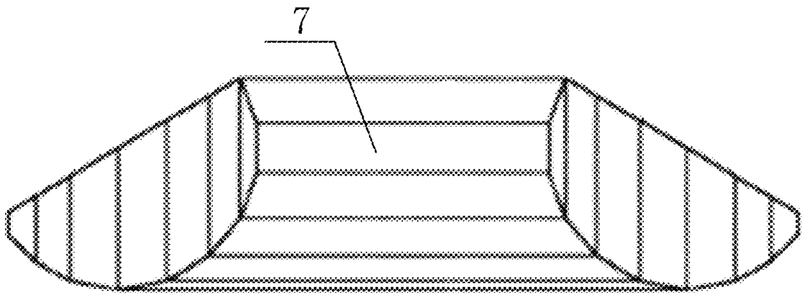
FIG. 8 is a schematic view showing the structure of a single iron core according to the embodiment of the present application.
Figure 9:
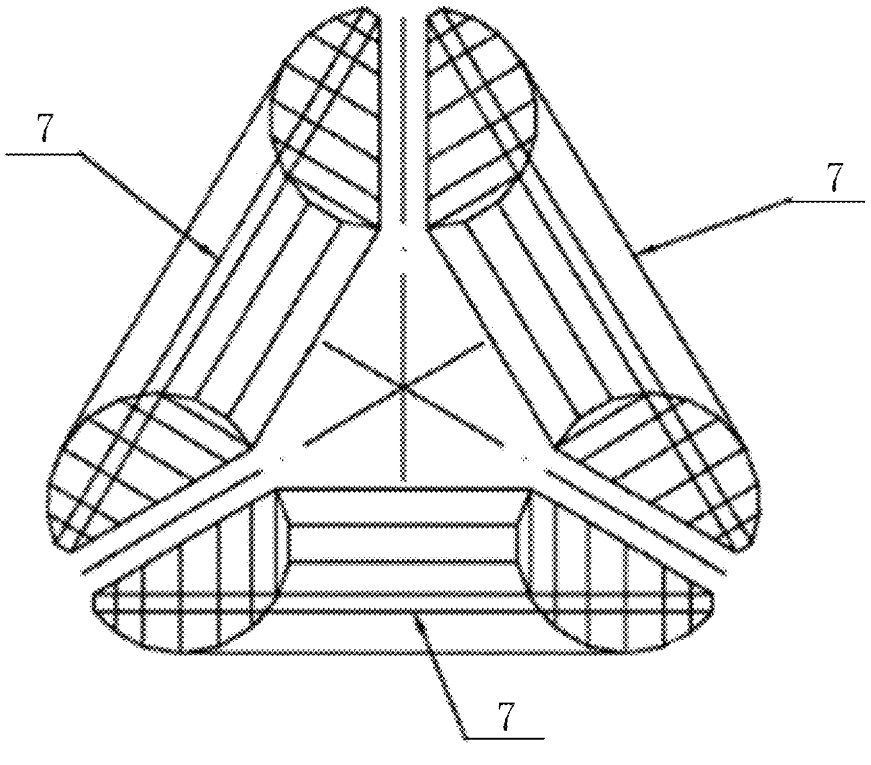
FIG. 9 is a schematic view showing the structure of three iron cores according to the embodiment of the present application when the three iron cores are in an assembling and moving process.
Figure 10:
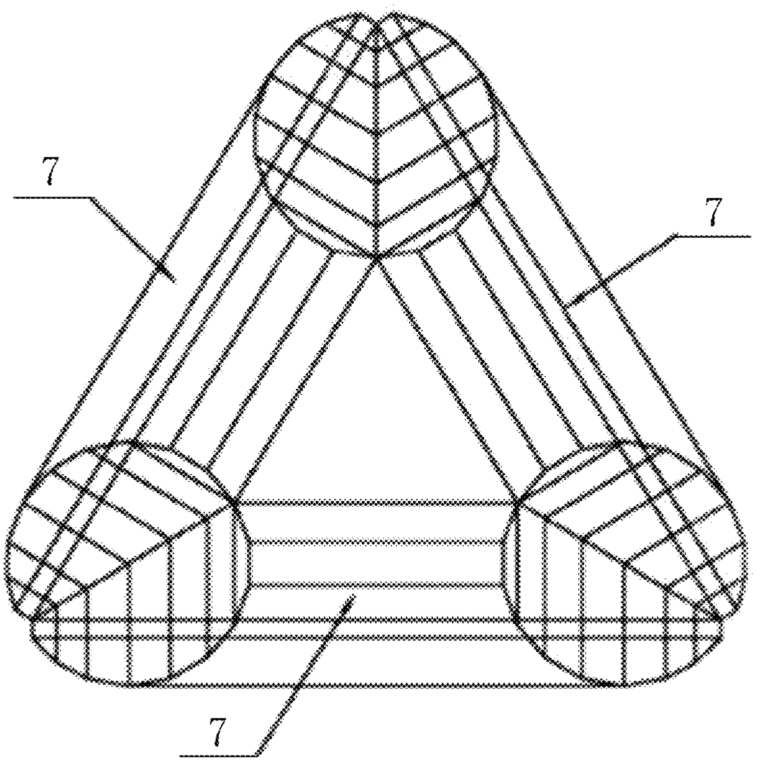
FIG. 10 is a schematic view showing the structure of the three iron cores according to the embodiment of the present application after the assembly is completed.

Referring to FIGS. 1 to 10, in a specific embodiment, an assembly device for a three-dimensional triangular iron core according to the present application includes iron core driving devices each configured for driving an iron core 7 to be assembled with adjacent iron cores 7. There are three iron core driving devices, and each of the iron core driving devices includes an iron core fixing device and a driving assembly for driving the iron core fixing device to move. Specifically, the iron core fixing device may be a snap locking device, and the snap locking device is configured to fix an upper portion and a bottom portion of the iron core 7, to allow the iron core 7 to be placed upright, as shown in FIG. 4. The driving assembly may be a telescopic cylinder, and driving assemblies are configured to drive snap locking devices to move, thereby driving two adjacent iron cores 7 to move toward each other. Specifically, an angle between moving directions of the two adjacent iron cores is 120 degrees. Specifically, when the iron core 7 is fixed on the iron core fixing device, the iron core 7 is in a suspended state in a case that the iron core 7 is at an upright position or a flat position, that is, the iron core 7 is only connected to the iron core fixing device. Specifically, the iron core 7 is preferably an amorphous alloy iron core.

In a case that the three-dimensional triangular iron core is required to be assembled, firstly, the three iron cores 7 are mounted on the corresponding iron core fixing devices, then iron core fixing devices are driven by the driving assemblies to move toward one another, thereby driving the adjacent iron cores 7 to move toward each other until the adjacent iron cores 7 are assembled, and then the two adjacent iron cores 7 are wound and assembled.

It can be seen from the above that, in the assembly device for the three-dimensional triangular iron core according to the embodiment of the present application, the driving assemblies drive the iron core fixing devices to move, thereby driving the adjacent iron cores 7 to be assembled, which avoids the situation that gravity of the iron core 7 is supported by itself during the assembly process, thus reducing the deformation of the iron core 7 during the assembly process, and thereby improving the assembly quality of the iron core 7.

Preferably, the drive assembly includes a support member 8 and a sliding device 2 for driving the support member 8 to move, and the iron core fixing device is mounted on the support member 8. Preferably, the sliding device 2 is a linear motor or a telescopic cylinder. Specifically, the telescopic cylinder may be an air cylinder or a hydraulic cylinder. The support member 8 may be set to have a predetermined shape as needed. In order to facilitate the processing and assembly of the assembly device for the three-dimensional triangular iron core, preferably, the support member 8 has a straight rod-shaped structure.

Further, the assembly device for the three-dimensional triangular iron core includes a bearing platform 1, and the driving assembly includes a guide rail 6 configured to allow the support member 8 to slide on. The guide rail 6 is mounted on the bearing platform 1, a bottom end of the support member 8 is provided with a slide groove cooperating with the guide rail 6, an angle between center lines of each two adjacent guide rails 6 in length directions is 120 degrees, and the sliding device 2 is mounted on the bearing platform 1. Specifically, the bearing platform 1 may be provided with a slide slot configured to allow the support member 8 to slide on, and a moving direction of the support member 8 is limited by the slide slot.

In order to improve assembly efficiency, preferably, the iron core fixing device includes a connecting member 3 and two electromagnets 4 configured to be fitted to upper and lower column sections respectively in a case that the iron core 7 is placed upright, and the two electromagnets 4 are mounted at opposite ends of the connecting member 3 respectively, the connecting member 3 is hinged to the support member 8, and when the iron core 7 is placed flat, the iron core 7 is supported by the two electromagnets 4. A side portion of a top end of the support member 8 is provided with a support portion configured for supporting the iron core 7 which is placed flat, and a side end of the support member 8 is provided with a limiting portion configured for limiting the iron core 7 which is placed upright. In a case that the iron core 7 is placed flat, the iron core 7 is supported by the support portion; and in a case that the iron core 7 is placed upright, the iron core 7 is limited by the limiting portion, such that the iron core 7 is in an upright state. Specifically, the support portion and the limiting portion are located at opposite sides of the support member 8. Magnetically attractive surfaces of the electromagnets 4 are attached to the column sections of the iron core 7, and the iron core 7 can be attracted after the electromagnets 4 are energized, so that the iron core 7 does not slip off or deform when it is turned over.

Preferably, the driving assembly further includes a turnover device for driving the iron core 7 to rotate, to allow the iron core 7 to be placed upright or flat, one end of the turnover device is connected to the support member 8, and another end of the turnover device is connected to the iron core fixing device. The turnover device may be a telescopic cylinder, a telescopic end of the telescopic cylinder is connected to the connecting member 3, and another end of the telescopic cylinder is mounted on the support member 8. The turnover device may further include a motor and a gear transmission device connected to an output end of the motor, and the connecting member 3 is provided with a rack engaged with a gear at the output end of the gear transmission device. With the rotation of the motor, the gear transmission device is driven to move, to drive the rack to move, and thereby achieving the rotation of the connecting member 3 with respect to a hinge point 5 of the support member 8. With the turnover device, the iron core 7 is automatically turned over, which reduces labor intensity of workers.

Specifically, when the assembly device of the three-dimensional triangular iron core is in operation, the two electromagnets 4 are first placed flat by the turnover device, and the iron core 7 is placed flat above the electromagnets 4, and in order to improve the stability of the connection, a bottom end of the iron core 7 may abut against a top end of the connecting member 3, to realize support; after the three iron cores 7 are placed in position, the electromagnets 4 are energized, and the three iron cores 7 are turned to an upright state by turnover devices, and then the iron cores 7 are driven by three sliding devices 2 respectively to move toward one another until side column sections of the three iron cores 7 are fitted to each other; then the iron cores 7 are wound, and after the iron cores 7 are fixed, the electromagnets 4 are deenergized, and the assembled three-dimensional triangular iron core is removed; and then the three iron core fixing devices are driven by the three sliding devices 2 to return to original positions, and after the three iron core fixing devices return to the original positions, the corresponding iron core fixing devices are placed flat by the three turnover devices, to be used for the assembly of the iron cores 7 next time. The operation is simple, and the assembly efficiency of the three-dimensional triangular iron core is effectively improved.

In order to facilitate winding of the two adjacent iron cores 7, preferably, a width "b" of the connecting member 3 is smaller than a width of a window "a" of the iron core 7, and a denotation "c" is a winding width of the iron core 7.

In view of the situation that each of the column sections of the iron core 7 is a flat surface, in order to make it convenient for the electromagnets 4 to effectively fix the iron core 7, preferably, each of the electromagnets 4 is of a rectangular structure which can be fitted to a corresponding column section of the iron core 7.

In order to improve safety in movement of the iron core 7, preferably, two ends of the guide rail 6 are each provided with a limiting block, to prevent the support member 8 from sliding off the guide rail 6. Specifically, the limiting block is mounted on the bearing platform 1 or the guide rail 6.

The above embodiments in this specification are described in a progressive manner. Each of the embodiments is mainly focused on describing its differences from other embodiments, and references may be made among these embodiments with respect to the same or similar portions among these embodiments.

Based on the above description of the disclosed embodiments, those skilled in the art are capable of carrying out or using the present application. It is obvious for those skilled in the art to make many modifications to these embodiments. The general principle defined herein may be applied to other embodiments without departing from the spirit or scope of the present application. Therefore, the present application is not limited to the embodiments illustrated herein, but should be defined by the broadest scope consistent with the principle and novel features disclosed herein.

The invention claimed is:

1. An assembly device for a three-dimensional triangular iron core, comprising iron core driving devices each configured for driving an iron core to be assembled with adjacent iron cores, wherein the number of the iron core driving devices is three, each of the iron core driving devices comprises an iron core fixing device and a driving assembly configured for driving the iron core fixing device to move; and wherein the iron core fixing device comprises a connecting member and two electromagnets configured to be fitted to upper and lower column sections respectively in a case that the iron core is placed upright, and the two electromagnets are mounted at two opposite ends of the connecting member respectively.

2. The assembly device for the three-dimensional triangular iron core according to claim 1, wherein the driving assembly comprises a support member and a sliding device configured for driving the support member to move, and the iron core fixing device is mounted on the support member.

3. The assembly device for the three-dimensional triangular iron core according to claim 2, further comprising a bearing platform, wherein the driving assembly further comprises a guide rail configured to allow the support member to slide on the guide rail, the guide rail is mounted on the bearing platform, a bottom end of the support member is provided with a slide groove cooperating with the guide rail, an angle between center lines of each two adjacent guide rails in length directions is 120 degrees, and the sliding device is mounted on the bearing platform.

4. The assembly device for the three-dimensional triangular iron core according to claim 3, wherein the connecting member is hinged to the support member, and in a case that the iron core is placed flat, the iron core is supported by the two electromagnets.

5. The assembly device for the three-dimensional triangular iron core according to claim 4, wherein the driving assembly further comprises a turnover device configured for driving the iron core to rotate, to allow the iron core to be placed upright or flat, one end of the turnover device is connected to the support member, and another end of the turnover device is connected to the iron core fixing device.

6. The assembly device for the three-dimensional triangular iron core according to claim 5, wherein the sliding device is a linear motor or a telescopic cylinder.

7. The assembly device for the three-dimensional triangular iron core according to claim 4, wherein a side portion of a top end of the support member is provided with a support portion configured for supporting the iron core in a case that the iron core is placed flat, and a side end of the support member is provided with a limiting portion configured for limiting the iron core in a case that the iron core is placed upright.

8. The assembly device for the three-dimensional triangular iron core according to claim 7, wherein the sliding device is a linear motor or a telescopic cylinder.

9. The assembly device for the three-dimensional triangular iron core according to claim 4, wherein a width of the connecting member is smaller than a width of a window of the iron core.

10. The assembly device for the three-dimensional triangular iron core according to claim 9, wherein the sliding device is a linear motor or a telescopic cylinder.

11. The assembly device for the three-dimensional triangular iron core according to claim 4, wherein each of the two electromagnets is of a rectangular structure allowed to be fitted to a corresponding column section of the iron core.

12. The assembly device for the three-dimensional triangular iron core according to claim 11, wherein the sliding device is a linear motor or a telescopic cylinder.

13. The assembly device for the three-dimensional triangular iron core according to claim 4, wherein the sliding device is a linear motor or a telescopic cylinder.

14. The assembly device for the three-dimensional triangular iron core according to claim 3, wherein two ends of the guide rail are each provided with a limiting block.

15. The assembly device for the three-dimensional triangular iron core according to claim 14, wherein the sliding device is a linear motor or a telescopic cylinder.

16. The assembly device for the three-dimensional triangular iron core according to claim 3, wherein the sliding device is a linear motor or a telescopic cylinder.

17. The assembly device for the three-dimensional triangular iron core according to claim 2, wherein the sliding device is a linear motor or a telescopic cylinder.

* * * * *